United States Patent
Izumi et al.

(10) Patent No.: US 9,219,253 B2
(45) Date of Patent: Dec. 22, 2015

(54) METHOD FOR MANUFACTURING ORGANIC EL DISPLAY DEVICE

(75) Inventors: Nozomu Izumi, Chiba (JP); Kenji Ookubo, Mobara (JP); Tomoyuki Hiroki, Mobara (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 394 days.

(21) Appl. No.: 13/453,824

(22) Filed: Apr. 23, 2012

(65) Prior Publication Data

US 2012/0276484 A1 Nov. 1, 2012

(30) Foreign Application Priority Data

Apr. 28, 2011 (JP) ................................. 2011-101426
Mar. 29, 2012 (JP) ................................. 2012-077573

(51) Int. Cl.
*H01L 21/312* (2006.01)
*H01L 21/3213* (2006.01)
*H01L 51/56* (2006.01)
*H01L 27/32* (2006.01)

(52) U.S. Cl.
CPC ............ *H01L 51/56* (2013.01); *H01L 27/3211* (2013.01)

(58) Field of Classification Search
USPC .................................................. 430/314, 316
See application file for complete search history.

(56) References Cited

U.S. PATENT DOCUMENTS

2005/0048414 A1  3/2005  Harnack et al.

FOREIGN PATENT DOCUMENTS

| CN | 1496666 A | 5/2004 |
| CN | 1653855 A | 8/2005 |
| EP | 1510861 A1 | 3/2005 |
| JP | 2003-36971 A | 2/2003 |
| TW | 200826330 A | 6/2008 |

*Primary Examiner* — Daborah Chacko Davis
(74) *Attorney, Agent, or Firm* — Canon U.S.A. Inc., IP Division

(57) ABSTRACT

A method for manufacturing an organic EL display device is provided in which an organic compound layer is formed by vapor deposition after a layer used for patterning the organic compound layer has been formed, so that the organic compound layer is formed without being affected by the surface tension of the sides of the layer for the patterning.

11 Claims, 6 Drawing Sheets

METHOD FOR MANUFACTURING ORGANIC EL DISPLAY DEVICE

BACKGROUND OF THE INVENTION

1. Field of the Invention

The present invention relates to a method for manufacturing an organic EL display device including a plurality of organic EL elements.

2. Description of the Related Art

Organic EL display devices, which are of self-emission type, are attracting attention as a type of flat panel display. An organic EL display device refers to a display device using as a display element an organic EL element including a pair of electrodes and an organic compound layer between the electrodes. For displaying color images, the organic EL display device may have a structure in which organic EL elements that emit white light and color filters for different colors are combined, or a structure in which a plurality of types of organic EL elements that emit different colors, such as red, green and blue lights, are arranged.

In an organic EL display device including a plurality of types of organic EL elements, different organic compound layers are formed for the different types of organic EL elements. Accordingly, each organic compound layer is selectively formed at a predetermined position by vacuum vapor deposition using a metal mask.

Nowadays, since high-definition display devices are being increasingly developed, it is required that such organic compound layers be formed with a high precision. However, vacuum vapor deposition using a metal mask has problems, for example, with working accuracy in the formation of the metal mask and with the distortion of the metal mask resulting from radiant heat generated during vapor deposition, and these problems make it difficult to produce high-definition display devices.

For selectively forming organic compound layers with a high precision, Japanese Patent Laid-Open No. 2003-36971 discloses a method for patterning an organic compound layer by photolithography. More specifically, a first luminescent layer is formed over the entire surface of a substrate by coating, and then a photoresist layer (release layer) is formed on the first luminescent layer. The photoresist layer is patterned by photolithography so as to remain in the region where the first luminescent layer will be formed, and then, the first luminescent layer is patterned using the photoresist layer as a mask. Subsequently, a second luminescent layer is formed by coating over the entire surface of the substrate on which the patterned first luminescent layer is disposed. Then, the photoresist layer and the portions of the second luminescent layer overlying the photoresist layer are separated (lifted off) together. In this process, the first and second luminescent layers that emit different hues from each other can be selectively formed with a high precision.

In Japanese Patent Laid-Open No. 2003-36971, the second luminescent layer is formed over the entire surface of the substrate by spin coating. Therefore, the second luminescent layer continuously covers the entire surface of the photoresist layer. When the substrate is immersed in a solution for dissolving the photoresist layer in order to lift off the second luminescent layer and the photoresist layer, however, the solution enters through defects of the second luminescent layer or penetrates the second luminescent layer to reach the release layer. Therefore, the solution for dissolving the photoresist layer cannot come into contact with the release layer efficiently to dissolve the release layer stably. This causes the increase in tact time and the decrease in yield.

SUMMARY OF THE INVENTION

Accordingly, the present invention provides a method for manufacturing a high-definition organic EL display device with a high yield.

The method manufactures an organic EL display device including a plurality of organic EL elements, each including a first and a second electrode and an organic compound layer between the first and second electrodes. The method includes forming a first organic compound layer over a substrate on which the first electrodes are disposed, forming a release layer on the first organic compound layer, removing the release layer and the first organic compound layer so as to remain on specific one or more of the first electrodes, forming a second organic compound layer by vapor deposition over the substrate on which the release layer and the first organic compound layer remain, removing the portion of the second organic compound layer overlying the release layer by dissolving the release layer, and forming a second electrode on the first organic and second organic compound layers remaining on the substrate.

In the method for manufacturing an organic EL display device of the present invention, the second organic compound layer is formed by vacuum vapor deposition that is a technique allowing the vapor of the material to go straight. Accordingly, the material of the organic compound layer is hardly deposited on the side surfaces of the release layer. Consequently, the release layer can be certainly brought into contact with a dissolving solution to dissolve the release layer stably, so that the organic EL display device can be manufactured with a high yield.

Further features of the present invention will become apparent from the following description of exemplary embodiments with reference to the attached drawings.

DESCRIPTION OF THE EMBODIMENTS

Figure 1A:
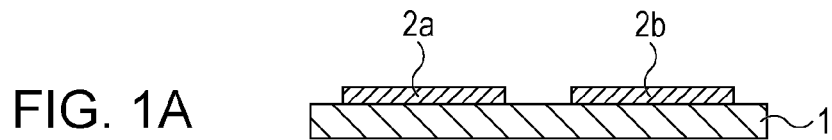
FIGS. 1A to 1G are sectional views illustrating the method for manufacturing an organic EL display device according to a first embodiment and Example 1 of the invention.

Some embodiments of the invention will now be described with reference to the drawings. The parts of the display device not shown in the drawings or not described herein can be formed by techniques known in the art. The following embodiments are some forms of the invention, and do not limit the invention.

First Embodiment

FIGS. 1A to 1G are sectional views illustrating the method for manufacturing an organic EL display device according to a first embodiment of the invention. The organic EL display device includes a first organic EL element including a first organic compound layer, and a second organic EL element including a second organic compound layer.

First, pluralities of first electrodes 2a and first electrodes 2b are formed on a substrate 1 (FIG. 1A). Any type of substrate 1 can be used without particular limitation, as long as an organic EL display device can be stably manufactured and the resulting organic EL display device can be operated. For example, a glass substrate or a Si wafer is used. The first electrodes 2a and 2b are made of an electroconductive material of which the film can be patterned. For example, the first electrodes 2a and 2b can be formed of a metal, such as Al or Ag, or a transparent electrode material, such as ITO or tin-containing zinc oxide. A multilayer film of these materials may be used.

The substrate 1 may be provided with a drive circuit for operating the organic EL display device as needed, and may be further provided, if necessary, with a planarizing layer for planarizing unevenness resulting from the presence of the drive circuit, and with a separation layer for separating the electrodes from each other and dividing the light-emitting region.

Figure 1B:
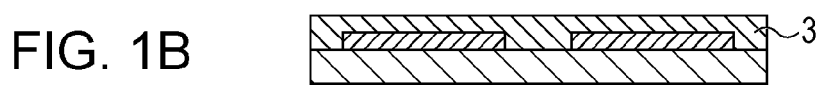

Then, a first organic compound layer 3 is formed in the region of the substrate where the first electrodes 2a and 2b have been formed (FIG. 1B). The material of the first organic compound layer 3 can be selected from known low-molecular-weight or macromolecular materials. The first organic compound layer 3 may include a luminescent layer and other function layers, such as a hole transport layer, a hole injection layer, an electron transport layer, and an electron injection layer, as needed.

Figure 1C:
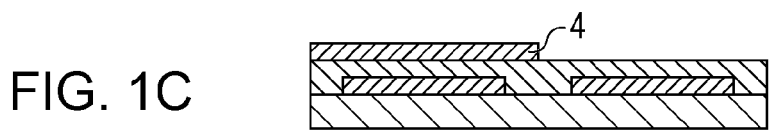

Then, a release layer 4 is selectively formed on the first organic compound layer, corresponding to predetermined one or more (first electrodes 2a) of the first electrodes 2a and 2b (FIG. 1C). The material of the release layer 4 can have a high solubility in a dissolving solution in which the first organic compound layer 3 exhibits a low solubility, and allow the release layer 4 to be formed without damaging the first organic compound layer 3. For example, if the first organic compound layer 3 is formed of a material that hardly dissolves in water, such as an arylamine derivative, a stilbene derivative, a polyarylene, or a condensed polycyclic hydrocarbon compound, water can be used as the dissolving solution (release solution) for dissolving the release layer 4. In this instance, the release layer 4 can be formed of a water-soluble inorganic material, such as LiF or NaCl, or a water-soluble polymer, such as polyvinyl alcohol (PVA) or polyvinyl pyrrolidone.

Various techniques can be applied for selectively forming the release layer 4, according to the characteristics of the material of the release layer 4. For example, the release layer 4 and a photoresist layer are formed by vacuum vapor deposition or coating over the entire surface of the substrate on which the first organic compound layer 3 has been formed, and then, the photoresist layer is patterned by photolithography. Alternatively, the release layer 4 may be formed of a photosensitive material over the entire surface of the substrate on which the first organic compound layer 3 has been formed, and then, the release layer 4 is patterned by photolithography. If the release layer 4 is formed of a macromolecular material, it can be selectively formed only in desired regions by an inkjet method or the like.

The entire release layer 4 is not necessarily dissolved in the release solution, as long as the layer on the first organic compound layer 3 can be separated from the substrate 1. For example, if the release layer 4 includes a plurality of sub layers, only the sub layer in contact with the first organic compound layer may be dissolved in the release solution.

Figure 1D:
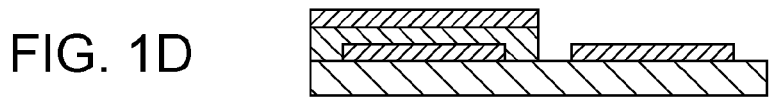

Then, the first organic compound layer 3 is patterned by removing the first organic compound layer from the region from which the release layer 4 has been removed (FIG. 1D). This step can be performed by dry etching or wet etching. If a photoresist layer is used for patterning the release layer 4, the release layer 4 and the first organic compound layer 3 can be simultaneously removed using the photoresist layer as a mask. If the release layer 4 is formed of a photosensitive material, the release layer 4 may be patterned by photolithography, and subsequently, the organic compound layer 3 is removed using the patterned release layer 4 as a mask. Alternatively, the release layer 4 and the first organic compound layer 3 may be removed by ablation performed by laser beam irradiation.

Figure 1E:
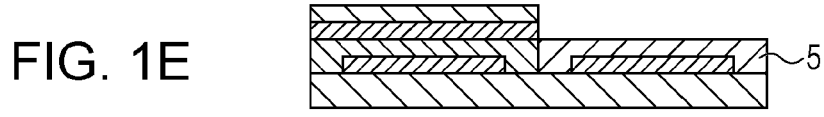

Subsequently, a second organic compound layer 5 that emits light having a different hue from the first organic compound layer 3 is formed by vacuum vapor deposition over the substrate 1 on which the patterned first organic compound layer 3 and release layer 4 are disposed (FIG. 1E). The second organic compound layer 5 can be formed of a known organic material that can be vapor-deposited. The second organic compound layer 5 may include a luminescent layer and other function layers, such as a hole transport layer, a hole injection layer, an electron transport layer, and an electron injection layer, as needed.

Figure 1F:
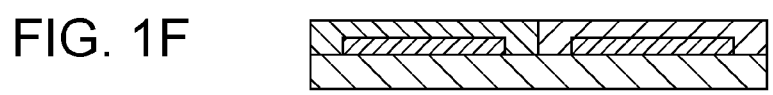

Subsequently, the second organic compound layer 5 and the release layer 4 are separated (lifted off) together (FIG. 1F). The lift-off technique is performed by immersing the substrate 1 in a dissolving solution (release solution) that can dissolve the release layer 4. In order to bring the release layer 4 into contact with the release solution reliably, it is advantageous to set the total thickness of the first organic compound layer 3 and the release layer 4 larger than the thickness of the second organic compound layer 5 formed in the step shown in FIG. 1E. Since vacuum vapor deposition is a technique allowing the vapor of the material to go straight, the material of the second organic compound layer 5 is hardly deposited on the side surfaces of the release layer 4. Consequently, the side surfaces of the release layer 4 can be exposed even after the second organic compound layer 5 has been formed, so that the release layer 4 can be certainly brought into contact with the release solution at the side surfaces of the release layer 4. Thus, the release layer 4 can be stably dissolved reliably. The portion of the second organic compound layer 5 overlying the release layer 4 is lifted off the substrate 1 by dissolving the release layer 4 at least at the interface with the first organic compound layer 3. Thus, the second organic compound layer 5 is patterned so as to remain in the region where the first organic compound layer 3 is not disposed.

In this step, an auxiliary substrate having an adhesive layer may be bonded to the surface of the second organic compound layer 5 overlying the release layer 4, and the substrate 1 is immersed in the release solution with the auxiliary substrate opposed. The second organic compound layer 5 separated from the substrate 1 by the dissolution of the release layer 4 is lifted off with the auxiliary substrate bound together. Therefore, pieces of the removed second organic compound layer 5 are not suspended in the release solution, and consequently, the first and second organic compound layers 3 and 5 on the substrate 1 can be prevented from being contaminated with or damaged by such pieces. Thus, the yield of organic EL elements in the manufacturing process can be further increased.

In addition, the vapor deposition of the second organic compound layer 5 has another effect as below. If the second organic compound layer 5 is formed on an uneven substrate by coating as disclosed in Japanese Patent Laid-Open No. 2003-36971, the thickness of the second organic compound layer 5 is increased in the vicinity of the release layer 4 by the surface tension of the side surface of the release layer 4. As a result, the thickness of the second organic compound layer 5 becomes uneven. If the second organic compound layer 5 locally has such uneven thicknesses in the light-emitting region thereof, the resistance of the second organic compound layer 5 is increased at the portion having a larger thickness. Consequently, current flow is concentrated to the thinner region and causes emission unevenness. In order to form a light-emitting region avoiding the region having uneven thicknesses, the light-emitting region is formed away from the end of the photoresist layer. Consequently, the aperture ratio is reduced and it becomes difficult to manufacture a high-definition display device. On the other hand, if the second organic compound layer 5 is formed by vapor deposition as in the present embodiment, a uniform thickness can be formed even though the surface of the substrate is uneven due to the presence of the release layer 4. Accordingly, even if the light-emitting region is spread to the vicinity of the release layer, emission unevenness does not occur. Consequently, the organic EL elements can be arranged with a high density, and thus an organic EL display device with a high definition or a high aperture ratio can be manufactured.

Figure 1G:
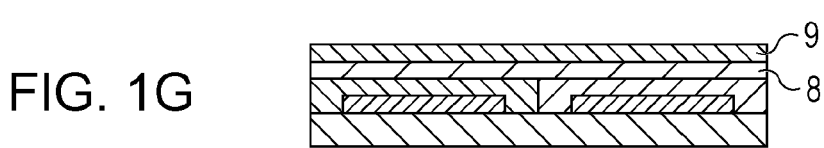

Finally, a common organic compound layer 8 and a second electrode 9 are formed in that order over the first and second organic compound layers 3 and 5 remaining on the substrate 1, and thus the organic EL display device is completed (FIG. 1G).

The second electrode 9 can be formed of any electroconductive material without particular limitation, as long as the second electrode 9 can be formed without damaging the organic layers. For example, the second electrode 9 can be formed of a metal, such as Al or Ag, or a transparent electrode material, such as ITO or tin-containing zinc oxide. A multilayer film of these materials may be used. In order to emit light outward from organic compound layers, at least either the first electrodes 2 or the second electrode 9 is made of a transparent or translucent material. In the description herein, the phrase "something is transparent" means that it has a transmittance of 80% or more for visible light, and the phrase "something is translucent" means that it has a transmittance of 20% to 80% for visible light. The common organic compound layer 8 may a carrier transport layer or carrier injection layer formed by vacuum vapor deposition. The common organic compound layer 8 is formed as needed, and may be omitted.

In order to prevent moisture from penetrating the organic EL elements, which are likely to be degraded with moisture, it is advantageous to provide a sealing structure. The sealing structure may be of film type, cap type, or the like. The sealing film includes one or more layers of moisture-proof films of, for example, silicon nitride or silicon oxide. The sealing cap is formed by fixing the edge of a moisture-proof sealing plate of glass or the like to the substrate 1 with an adhesive or glass frit. For forming a sealing structure, the route of moisture can be disrupted by forming a region in the outer portion of the substrate 1 where the organic compound layer is not disposed so that the region where the organic EL elements are disposed can be separated from the exterior of the sealing structure. For example, the first organic compound layer 3 is patterned so as not to be formed in the outer portion of the substrate 1, and then, the second organic compound layer 5 and the common organic compound layer 8 are formed by vacuum vapor deposition in a state where the outer portion of the substrate covered with a rough mask or the like. Then, a sealing film is formed over the substrate including the outer portion not provided with the organic compound layer, or a sealing plate is joined to the substrate at the outer portion of the substrate.

Thus, an organic EL color display device can be manufactured with a high yield which includes first organic compound layers 3 on first electrodes 2a and second organic compound layers 5 on first electrodes 2b so that these organic compound layers emit different color lights. While a pattern formed by vapor deposition using a metal mask is as large as at least about 10 μm, the method of the present embodiment can form a pattern having fine shapes and sizes that is generally formed by photolithography. For example, a 1 μm high-definition line-and-space pattern can be formed.

Second Embodiment

Figure 2A:
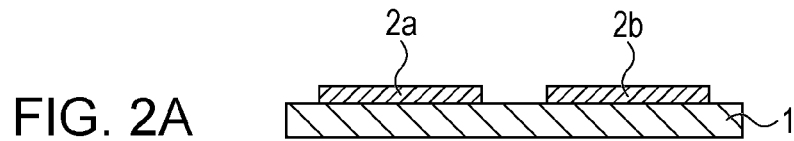
FIGS. 2A to 2H are sectional views illustrating the method for manufacturing an organic EL display device according to a second embodiment of the invention.
Figure 2B:
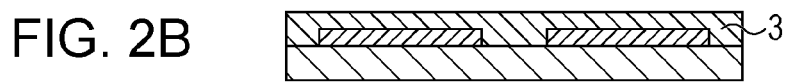
Figure 2C:
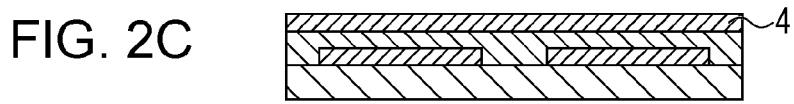
Figure 2D:
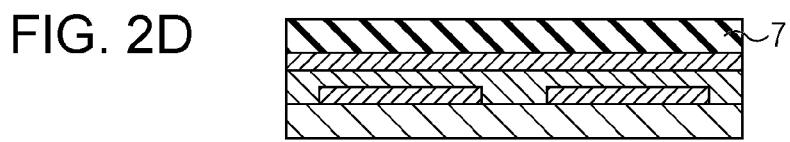
Figure 2E:
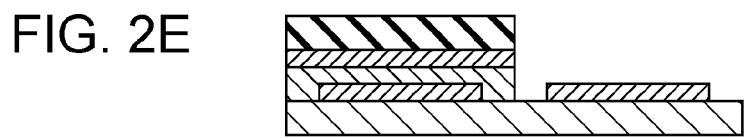
Figure 2F:
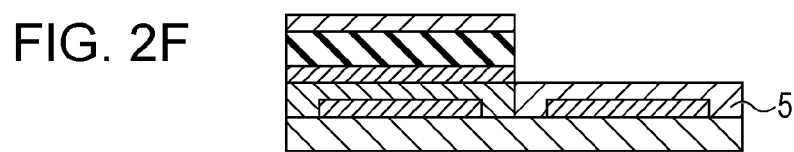
Figure 2G:
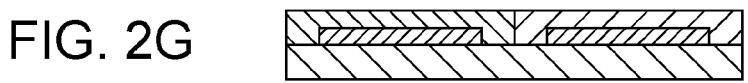
Figure 2H:
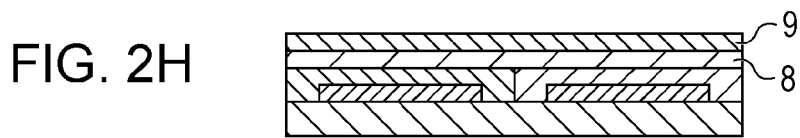

FIGS. 2A to 2H are sectional views illustrating the method for manufacturing an organic EL display device according to a second embodiment of the invention. The present embodiment is different from the first embodiment in that a protective layer 7 is formed on the release layer 4 as shown in FIG. 2D, followed by patterning the protective layer 7, the release layer 4 and the first organic compound layer 3.

The protective layer 7 protects the release layer 4 or the first organic compound layer 3 from the damage of the subsequent steps. By providing the protective layer 7, the materials of the release layer 4 and the first organic compound layer 3 can be selected from a wide range of choices.

In the first embodiment, in which the release layer 4 and the first organic compound layer 3 are patterned using a photoresist without forming the protective layer 7, the release layer 4 is made of a material having a sufficiently low solubility in the solvent and developer of the photoresist. In addition, the material of the release layer 4 is such that it has a high solubility in a dissolving solution in which the first organic compound layer 3 has a low solubility, and such that it can form the release layer 4 without damaging the first organic compound layer 3. The material of the release layer 4 is selected from a range of choices limited so as to satisfy these requirements.

It is therefore advantageous to form a protective layer 7 of a material that will not be dissolved during the formation of the photoresist layer or during photolithography. The protective layer 7 is formed using a material and a method that do not adversely affect the release layer 4, for example, not degrade or dissolve the release layer 4. The protective layer 7 can be formed of any material, as long as it can protect the release layer 4 from the solvent in the photoresist and from damage of the photolithography, and may be an inorganic film or an organic film of a polymer or the like. Also, the protective layer 7 can be formed by a dry process, such as sputtering or CVD, or a wet process, such as coating, as long as the release layer 4 is not affected by the process. From the viewpoint of protecting the release layer 4 from the damage of the process, however, the protective layer 7 can be a moisture-proof inorganic film, such as a silicon nitride film or a silicon oxide film, formed by a dry process, such as sputtering or CVD. These silicon nitride and silicon oxide films are insoluble in solvents contained in general photoresists, and can prevent the penetration of the solvent. Accordingly, the release layer 4 can have more choices of materials, and the patterning of the protective layer 7, the release layer 4 and the first organic compound layer 3 shown in FIG. 2E can be performed by photolithography using an ordinary photoresist. The patterning of the protective layer 7, the release layer 4 and the first organic compound layer 3 can be performed by dry etching.

Wet etching may be performed. If wet etching is performed, the dissolving solution is selected so that these layers are not separated off even if the dissolving solution enters through the sides of the layers during patterning. The step of forming the second organic compound layer 5 and subsequent steps can be performed in the same manner as in the first embodiment, and thus description thereof is omitted.

Third Embodiment

Figure 3A:
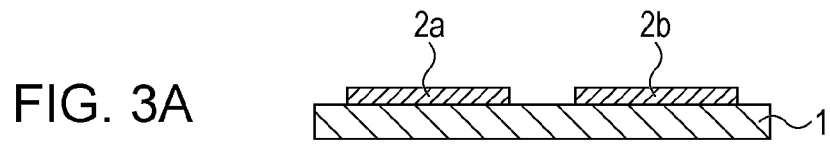
FIGS. 3A to 3H are sectional views illustrating the method for manufacturing an organic EL display device according to a third embodiment of the invention.
Figure 3B:
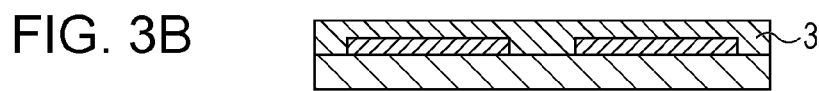
Figure 3C:
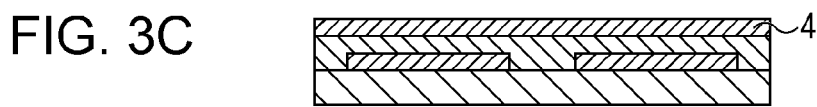
Figure 3D:
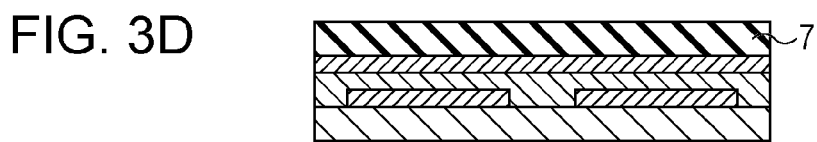
Figure 3E:
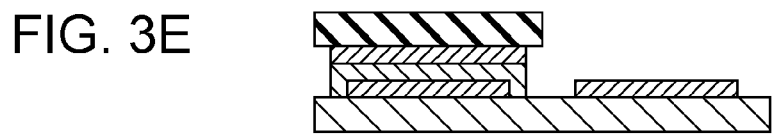
Figure 3F:
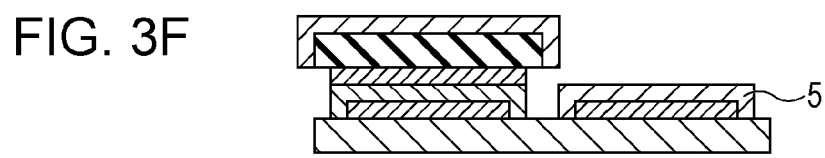
Figure 3G:
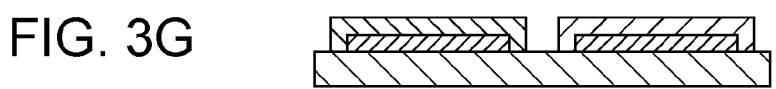
Figure 3H:
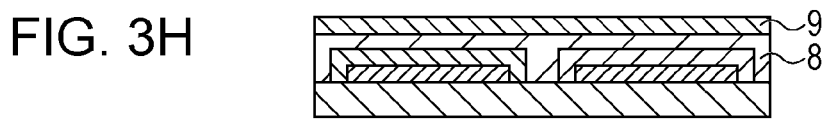

FIGS. 3A to 3H are sectional views illustrating the method for manufacturing an organic EL display device according to a third embodiment of the invention. The present embodiment is different from the second embodiment in that the protective layer 7 is patterned so as to remain in a wider region than the release layer 4, as shown in FIG. 3E. In order for the protective layer 7 to remain in a wider region than the release layer 4, the protective layer 7, the release layer 4 and the first organic compound layer 3 are patterned by, for example, dry etching using an etching gas with which the release layer 4 can be etched at a higher rate than the protective layer 7. For the dry etching, the substrate 1 is placed on one of the electrodes of the etching apparatus with the other electrode opposing the substrate 1, and an electric field is applied between the electrodes. In this instance, the etching proceeds not only in the direction parallel to the electric field, but also in the direction perpendicular to the electric field (side etching). Thus, the region of the material to be etched (release layer 4) can become smaller than that of the masking material (protective layer 7). In this structure, the protective layer 7 shades the sides of the release layer 4. Thus, the deposition material is hardly deposited on the sides of the release layer 4 patterned as shown in FIG. 3F even if the deposition material is ejected from an oblique direction with the surface of the substrate 1, and the sides of the release layer 4 can be exposed.

In other words, the method of the present embodiment increases the allowable range of the incident angle of the molecules of the deposition material on the substrate. Consequently, when the size of the substrate is increased, deposition can be performed by relatively shifting the positions of the deposition source and substrate. Thus, a uniform thickness of the substrate can be maintained, and the size of the substrate can be increased easily.

Fourth Example

FIGS. 4A to 4M are sectional views illustrating the method for manufacturing an organic EL display device according to a fourth embodiment of the invention. FIGS. 4A to 4M show only a set of organic EL elements. In the present embodiment, a method for manufacturing an organic EL display device including three types of organic EL elements will be described. In this method, a protective layer 7 is formed on the release layer 4 in the same manner as in third embodiment. When the same material or the same method as in any other embodiment is applied, part of the description thereof may be omitted.

Figure 4A:
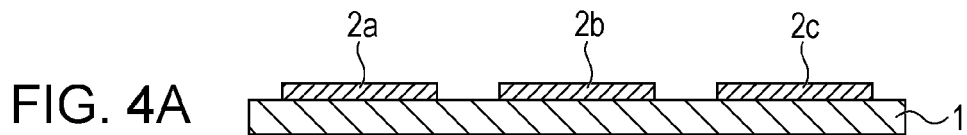
FIGS. 4A to 4M are sectional views illustrating the method for manufacturing an organic EL display device according to a fourth embodiment and Example 2 of the invention.
Figure 4B:
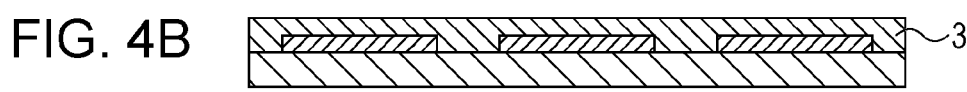
Figure 4C:
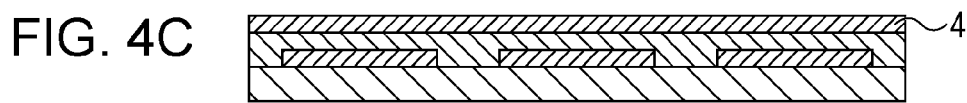

First, a substrate 1 on which pluralities of first electrodes 2a, first electrodes 2b and first electrodes 2c have been formed is prepared, as in the first embodiment (FIG. 4A). Subsequently, a first organic compound layer 3 is formed over a substrate 1 on which the first electrodes 2a, 2b and 2c are disposed (FIG. 4B). Then, a first release layer 4 is formed on the first organic compound layer 3 (FIG. 4C). The first release layer 4 is formed of the same material as the release layer 4 of the third embodiment.

Figure 4D:
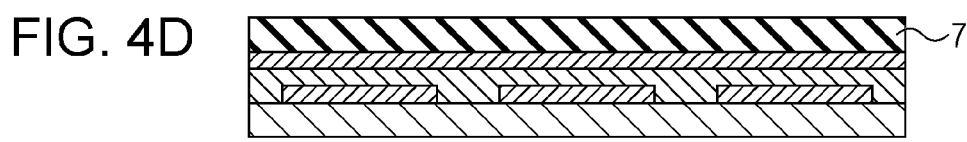
Figure 4E:
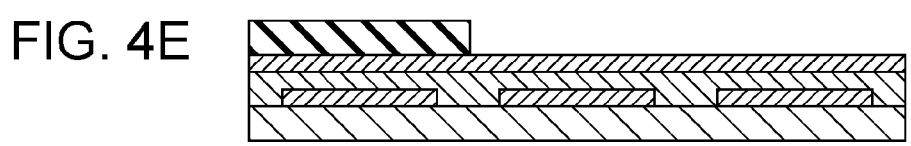
Figure 4F:
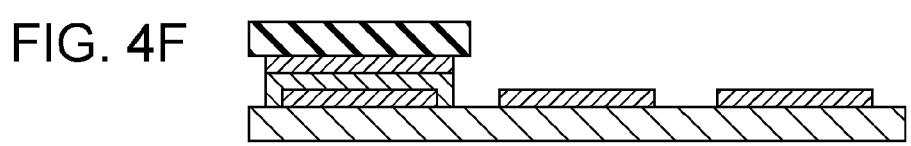

A first protective layer 7 is formed over the entire region of the substrate 1 where the first release layer 4 is disposed (FIG. 4D), and is then patterned to remove the portion of the protective layer 7 overlying first electrodes 2b and 2c (FIG. 4E). Subsequently, the portions of the first release layer 4 and first organic compound layer 3 not covered with the first protective layer 7 are removed in the same manner as in the third embodiment, using the first protective layer 7 remaining only on first electrode 2a as a mask (FIG. 4F).

Figure 4G:
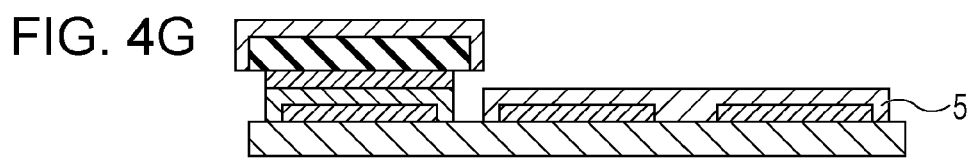
Figure 4H:
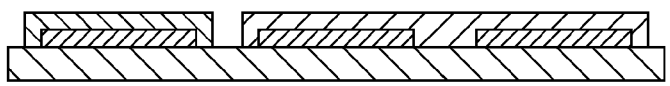

Then, a second organic compound layer 5 is formed on the patterned first protective layer 7 and the first electrodes 2b and 2c by vapor deposition (FIG. 4G). The substrate 1 on which the second organic compound layer 5 has been formed is immersed in a release solution for the first release layer 4, and, thus, the first protective layer 7 and the portion of the second organic compound layer 5 overlying the first protective layer 7 are lifted off by dissolving the first release layer 4 (FIG. 4H). In this step, if the thickness of the second organic compound layer 5 formed in the step shown in FIG. 4G is smaller than the total thickness of the first organic compound layer 3 and the first release layer 4, the release solution penetrates the first release layer 4 through the exposed side surfaces of the first release layer 4, and thus can dissolve the release layer 4 reliably.

Figure 4I:
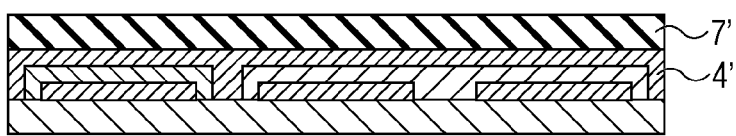

Subsequently, a second release layer 4' and a second protective layer 7' are formed in that order over the surface of the substrate on which the first organic compound layer 3 and the second organic compound layer 5 have been formed, as shown in FIG. 4I. For the second release layer 4', a material is selected which can form the second release layer 4' without damaging the first and second organic compound layers 3 and 5 and has a high solubility in a dissolving solution in which the first and second organic compound layers 3 and 5 have low solubilities. If the first and second organic compound layers 3 and 5 are formed of water-insoluble materials, such as arylamine derivatives, stilbene derivatives, polyarylenes, and condensed polycyclic hydrocarbon compounds, water can be used as the release solution for the second release layer 4'. In this instance, the second release layer 4' can be formed of a water-soluble inorganic material, such as LiF or NaCl, or a water-soluble polymer, such as polyvinyl alcohol (PVA) or polyvinyl pyrrolidone. The method for forming the second release layer 4' can be selected from vapor deposition, coating and other methods according to the material, as in the formation of the first release layer 4. The second protective layer 7' can be formed of the same material by the same process as the first protective layer 7.

Figure 4J:
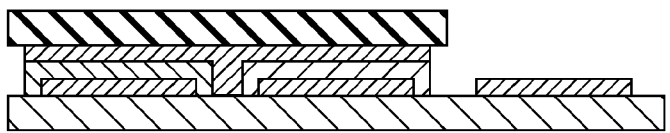

Then, the portions of the second protective layer 7', second release layer 4' and second organic compound layer 5, overlying first electrodes 2c are removed (FIG. 4J). This patterning of the second protective layer 7', the second release layer 4' and the second organic compound layer 5 can be performed in the same manner as the patterning of the first protective layer 7, the first release layer 4 and the first organic compound layer 3.

Figure 4K:
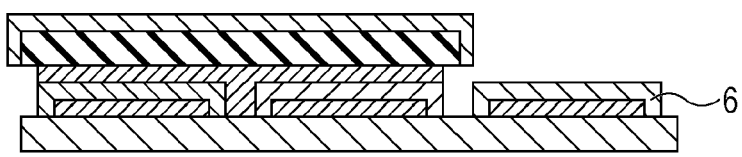

Subsequently, a third organic compound layer 6 is formed by vapor deposition over the surface of the substrate 1 on which first electrodes 2c and layers up to the second protective layer 7' overlying first electrodes 2a and 2b have been formed (FIG. 4K). A known material and structure can be selected for the third organic compound layer 6. At this time, the third organic compound layer 6 can be formed to a thickness smaller than at least either the total thickness of the first organic compound layer 3 and the second release layer 4' or the total thickness of the second organic compound layer 5 and the second release layer 4'. Thus, the material of the third organic compound layer 6 is hardly deposited on the sides of the second release layer 4' so that part of the second release layer 4' can be exposed. Consequently, the release solution can penetrate the second release layer 4' from the exposed portion, thus certainly dissolving the second release layer 4'. By forming the third organic compound layer by vapor deposition, the emission unevenness of the organic EL elements including the third organic compound layer can be reduced to achieve a high definition or a high aperture ratio, as in the case of forming the second organic compound layer by vapor deposition. Consequently, the resulting organic EL display device can have a high definition or a high aperture ratio.

Figure 4L:
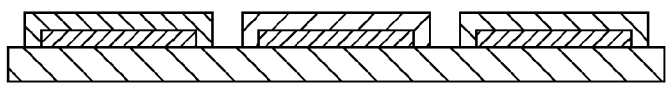

Then, the second protective layer 7' and the portion of the third organic compound layer 6 overlying the second protective layer 7' are lifted off by dissolving the second release layer 4' (FIG. 4L). The removal of the second release layer 4', the second protective layer 7' and the portion of the third organic compound layer 6 overlying the second protective layer 7' can be performed in the same manner as in the step shown in FIG. 4G.

Figure 4M:
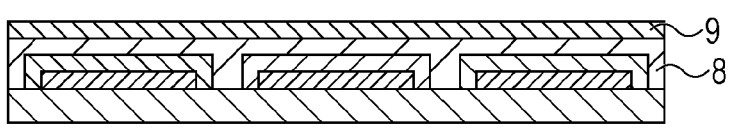

Finally, as shown in FIG. 4M, a common organic compound layer 8 and a second electrode 9 are formed over the first, second and third organic compound layers 3, 5 and 6, and thus, the organic EL display device is completed. The common organic compound layer 8 may be a hole transport layer, an electron transport layer or an injection layer, or a composite including these layers, and is formed using known low-molecular-weight materials or macromolecular materials. The common organic compound layer 8 is formed as needed, and may be omitted.

In order to prevent moisture from entering the organic compound layers, it is advantageous to form a sealing member over the second electrode 9, as described in the first embodiment.

Thus, a high-definition organic EL color display device can be manufactured as described above which includes a first organic compound layer 3 on first electrodes 2a, a second organic compound layer 5 on first electrodes 2b and a third organic compound layer on first electrodes 2c so that these organic compound layers emit different color lights. For example, by using materials that emit red, blue and green lights for the first, second and third organic compound layers 3, 5 and 6, respectively, a full-color organic EL display device can be achieved.

Examples of the invention will now be described with reference to some of the drawings.

Example 1

Figure 5:
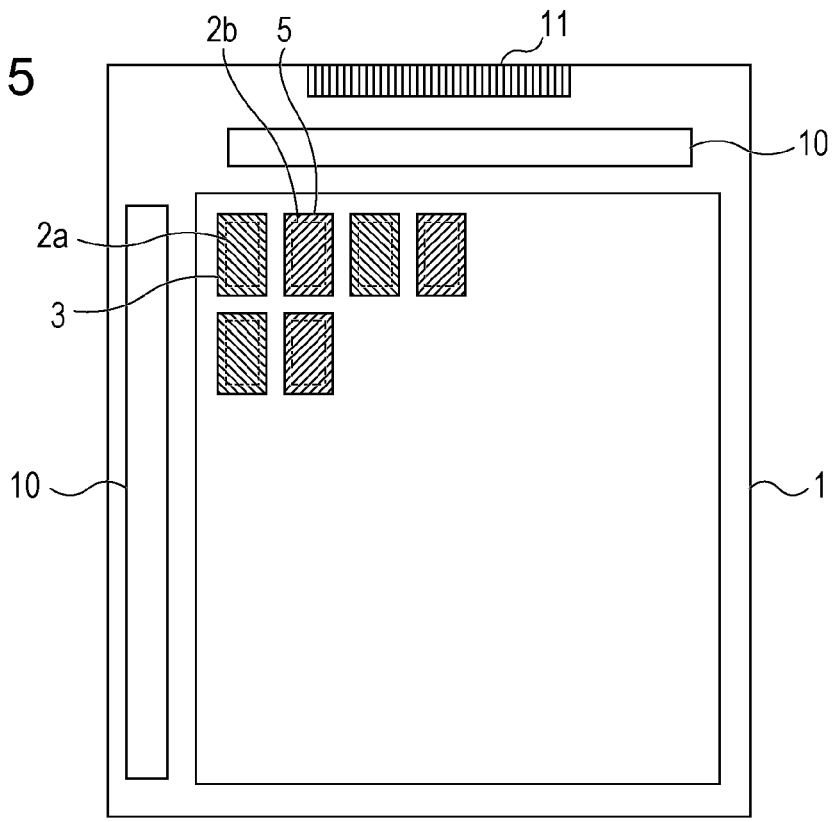
FIG. 5 is a schematic top view of the organic EL display device of Example 1.

The procedure for producing an organic EL display device of Example 1 will be described with reference to FIGS. 1A to 1G. FIGS. 1A to 1G show part of the organic EL display device. The top view of the organic EL display device of Example 1 is shown in FIG. 5. The substrate 1 has thereon an external terminal 11 connected to an external power source and external circuit to receive power and signals, a peripheral circuit 10 to operate organic EL elements, and the organic EL elements, each including either a first organic compound layer 3 or a second organic compound layer 5. The organic EL display device further includes other members not shown in the figures, such as wires connecting the external terminal 11 with the peripheral circuit 10, and a pixel circuit.

First, as shown in FIG. 1A, pluralities of first electrodes 2a and first electrodes 2c were formed on a glass substrate 1. First electrodes 2a were formed for a first organic compound layer 3, and first electrodes 2b were formed for a second organic compound layer 5. The first organic compound layer 3 and the second organic compound layer 5 emit different color lights. As shown in FIG. 5, first electrodes 2a and first electrodes 2b were alternately arranged in the row direction on the substrate 1 in such a manner that first electrodes on which the same organic compound layer would be formed were arranged in the column direction.

For the first electrodes 2a and 2b, a layer for the first electrodes was formed on one surface of the substrate 1 by sputtering, and was patterned by photolithography into first electrodes 2a and first electrodes 2b, each corresponding to the organic EL element. The first electrodes 2a and 2b had a multilayer structure including a 200 nm thick Al layer and a 20 nm thick tin-doped zinc oxide film that had been formed in that order on the substrate 1. The first electrodes 2a and 2b measured 50 μm in width by 150 μm in length, and were arranged at intervals of 5 μm. A separation film (not shown) of a polyimide resin was formed to a thickness of 2 μm between the first electrodes 2a and 2b.

Then, the first organic compound layer 3 was formed by vapor deposition over the surface of the substrate on which the patterned first electrodes 2a and 2b were disposed, as shown in FIG. 1B. The first organic compound layer 3 included a hole injection layer, a hole transport layer and a luminescent layer. The luminescent layer of the first organic compound layer 3 contained a known low-molecular-weight material that emits yellow light. The total thickness of the first organic compound layer 3 was 200 nm.

Then, a release layer 4 was formed on the first organic compound layer 3, as shown in FIG. 1C. The formation of the release layer 4 was performed by an ink jet method so that the release layer 4 would be formed only on the portions of the first organic compound layer 3 overlying first electrodes 2a. A polyvinyl pyrrolidone aqueous solution was used for the release layer 4. The polyvinyl pyrrolidone aqueous solution was applied to desired portions and dried. The resulting release layer had a thickness of 600 nm.

Then, the portion of the first organic compound layer 3 not covered with the release layer 4 was removed by dry etching using the release layer 4 as a mask, as shown in FIG. 1D. The dry etching was performed with a reactive ion etching (RIE) apparatus using $O_2$ gas as an etching gas. Not only the first organic compound layer 3, but also the surface of the release layer 4 were removed by this dry etching, and the thickness of the release layer 4 was reduced to 300 nm after the removal of the first organic compound layer 3.

Then, a second organic compound layer 5 was formed by vapor deposition on the substrate 1 in the region where the first organic compound layer 3 had been removed, as shown in FIG. 1E. The second organic compound layer 5 included a hole injection layer, a hole transport layer and a luminescent layer, each formed of a known low-molecular-weight organic material by vapor deposition. The luminescent layer of the second organic compound layer 5 contained a known low-molecular-weight material that emits blue light. The total thickness of the second organic compound layer 5 was 150 nm.

The substrate 1 on which the layers up to the second organic compound layer 5 had been formed was immersed in running water. The release layer 4, which was formed of water-soluble polyvinyl pyrrolidone, was dissolved in the running water, so that the portion of the second organic compound layer 5 overlying the release layer 4 was lifted off, as shown in FIG. 1F. For this operation, the total thickness of the first organic compound layer 3 and the release layer 4 was set to 500 nm so as to be larger than the thickness (150 nm) of the second organic compound layer 5, before the formation of the second organic compound layer 5. Consequently, the sides of the release layer 4 were not covered with the second organic compound layer 5. Thus, the release solution certainly penetrated the release layer 4, so that the portion of the second organic compound layer 5 overlying the release layer 4 was lifted off.

Subsequently, as shown in FIG. 1G, a common organic compound layer 8 and a second electrode 9 were formed in that order over the first organic compound layer 3 and the second organic compound layer 5. The common organic compound layer included an electron transport layer and an electron injection layer, each formed of a known low-molecular-weight material by vapor deposition. The total thickness of the common organic compound layer 8 was 50 nm. The second electrode 9 was formed of Ag to a thickness of 20 nm by sputtering. Then, a 2000 nm thick silicon nitride layer was formed on the second electrode 9 by plasma CVD. This layer was used as a sealing film (not shown) to prevent moisture from entering the organic compound layers.

Thus, an organic EL display device was produced which included pluralities of two types of organic EL elements that emit light having a yellow hue or a blue hue. Emission of yellow and blue lights from the organic EL elements was observed through an optical microscope, and emission unevenness was not observed in any organic EL element.

Example 2

Figure 6:
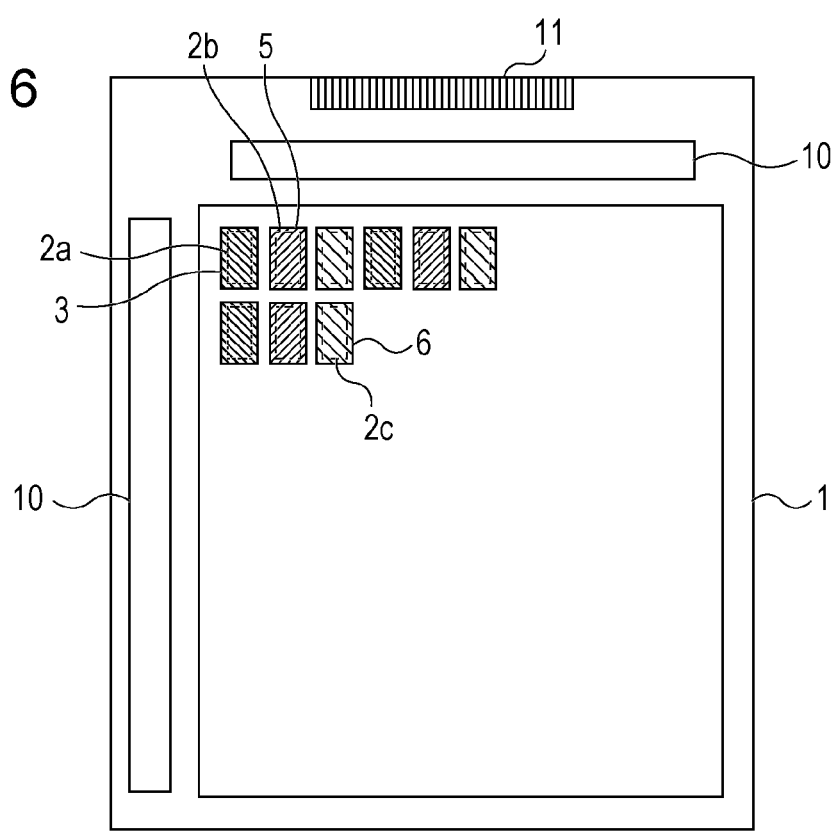
FIG. 6 is a schematic top view of the organic EL display device of Example 2.

The procedure for producing an organic EL display device of Example 2 will be described with reference to FIGS. 4A to 4M. FIGS. 4A to 4M show part of the organic EL display device. The top view of the organic EL display device of Example 2 is shown in FIG. 6.

First, as shown in FIG. 4A, pluralities of first electrodes 2a, first electrodes 2b, and first electrodes 2c were formed on a glass substrate 1. First electrodes 1a were formed for first organic compound layers, first electrodes 1b were formed for second organic compound layers, and first electrodes 1c were formed for third organic compound layers. As shown in FIG. 6, first electrodes 2a, first electrodes 2b and first electrodes 2c were alternately arranged in that order in the row direction on the substrate 1 in such a manner that first electrodes on which the same organic compound layer would be formed were arranged in the column direction. For the first electrodes 2a, 2b and 2c, a layer for the first electrodes was formed over the entirety of one surface of the substrate 1 by sputtering, and was patterned by photolithography into first electrodes 2a, first electrodes 2b and first electrodes 2c, each corresponding to the organic EL element. The first electrodes 2a to 2c each had a multilayer structure including a 200 nm thick Al layer and a 20 nm thick mixed layer (InZnO) of indium oxide and zinc oxide that had been formed in that order. The first electrodes 2a, 2b and 2C measured 0.6 μm in width by 1.8 μm in length, and were arranged at intervals of 0.6 μm.

Then, a first organic compound layer 3 was formed by vapor deposition over the surface of the substrate 1 on which the first electrodes 2a, 2b and 2c had been formed, as shown in FIG. 4B, in the same manner as in Example 1. The luminescent layer of the first organic compound layer 3 contained a known low-molecular-weight organic material that emits red light. The total thickness of the first organic compound layer 3 was 250 nm.

Then, a first release layer 4 was formed on the first organic compound layer 3, as shown in FIG. 4C. The first release layer 4 was formed by applying a polyvinyl pyrrolidone aqueous solution by spin coating, followed by drying. The thickness of the polyvinyl pyrrolidone coating was 400 nm after drying. A first protective layer 7 was further formed on the first release layer 4. For the first protective layer 7, silicon nitride was deposited to a thickness of 2000 nm by CVD, as shown in FIG. 4D.

Subsequently, the first protective layer 7 was patterned so as to remove the portions thereof overlying first electrodes 2b and 2c, as shown in FIG. 4E. The patterning of the first protective layer 7 was performed by dry etching using as a mask a photoresist layer selectively formed on the portion of the first protective layer 7 overlying first electrodes 2a by photolithography. The dry etching was performed with an RIE apparatus using $CF_4$ gas as an etching gas.

Subsequently, as shown in FIG. 4F, the portions, not covered with the first protective layer 7, of the first release layer 4 and first organic compound layer 3 overlying first electrodes 2b and 2c were removed by dry etching using the patterned first protective layer 7 overlying first electrodes 2a as a mask. The dry etching was performed with a reactive ion etching (RIE) apparatus using $O_2$ gas as an etching gas. In this step, the etching rates of the first release layer 4 and the first organic compound layer 3 were higher than the etching rate of the first protective layer 7. Under such conditions, etching was performed until the first release layer 4 and the first organic compound layer 3 were side-etched into a state where the ends of the patterned first release layer 4 and first organic compound layer 3 were positioned 100 nm inward from the ends of the patterned first protective layer 7.

Then, as shown in FIG. 4G, a second organic compound layer 5 was formed over the surface of the substrate 1 on which the first protective layer 7 had been patterned. The second organic compound layer 5 included a hole injection layer, a hole transport layer and a luminescent layer, each formed of a known low-molecular-weight organic material by vapor deposition. The vapor deposition of the second organic compound layer 5 was performed while a crucible containing a vapor deposition material was moved relative to the substrate 1 so that the second organic compound layer 5 could have a more uniform thickness. The luminescent layer of the second organic compound layer 5 contained a known low-molecular-weight organic material that emits green light. The total thickness of the second organic compound layer 5 was 200 nm. In this instance, since the ends of the first release layer 4 and first organic compound layer 3 were positioned inward from the ends of the first protective layer 7, as shown in FIGS. 4F and 4G, the material of the second organic compound layer 5 was hardly deposited on the sides of the first release layer 4 shaded by the first protective layer 7. In addition, since the thickness of the first release layer 4 was set so that the total thickness of the first organic compound layer 3 and the first release layer 4 would become larger than the total thickness of the second organic compound layer 5, the portion of the second organic compound layer 5 overlying the protective layer 7 and the other portion of the second organic compound layer 5 were discontinuous. Thus the side surfaces of the first release layer 4 were exposed.

The substrate 1 on which the layers up to the second organic compound layer 5 had been formed was immersed in running water. The first release layer 4, which was formed of water-soluble polyvinyl pyrrolidone, was dissolved in the running water, so that the portions of the first protective layer 7 and second organic compound layer 5 overlying the first release layer 4 were lifted off reliably as shown in FIG. 4H.

Subsequently, a second release layer 4' and a second protective layer 7' were formed in that order over the surface of the substrate on which the first organic compound layer 3 and the second organic compound layer 5 had been formed, as shown in FIG. 4I. The second release layer 4' and the second protective layer 7' were formed of the same materials by the same methods as the first release layer 4 and the first protective layer 7, respectively.

Then, the portions of the second protective layer 7', second release layer 4' and second organic compound layer 5 overlying first electrodes 2c were removed by patterning, as shown in FIG. 4J. The patterning of the second protective layer 7', the second release layer 4' and the second organic compound layer 5 was performed in the same manner as in the steps shown in FIGS. 4E and 4F. As a result, the ends of the second release layer 4 were positioned inward from the ends of the second protective layer 7.

Subsequently, a third organic compound layer 6 was formed on first electrodes 2c and the second protective layer 7', as shown FIG. 4K. The third organic compound layer 6 included a hole injection layer, a hole transport layer and a luminescent layer, each formed of a known low-molecular-weight organic material by the same vapor deposition as the second organic compound layer 5. This luminescent layer contained a material that emits blue light. The total thickness of the third organic compound layer 6 was 150 nm. After the formation of the third organic compound layer 6, the sides of the second release layer 4' were exposed, as in the step shown in FIG. 4F.

Then, the second protective layer 7' and the third organic compound layer 6 overlying the second release layer 4' were removed, as shown in FIG. 4L. By immersing the substrate 1 on which the layers up to the third organic compound layer 6 had been formed in running water, the second release layer 4' was dissolved to remove the second protective layer 7' and the portion of the third organic compound layer 6 overlying the second protective layer 7' in the same manner as in the step shown in FIG. 4H.

Then, as shown in FIG. 4M, a common organic compound layer 8 and a second electrode 9 were formed in that order over the first organic compound layer 3, the second organic compound layer 6 and the third organic compound layer 6. The common organic compound layer included an electron transport layer and an electron injection layer, each formed of a known low-molecular-weight material by vapor deposition. The total thickness of the common organic compound layer 8 was 50 nm. The second electrode 9 was formed of Ag to a thickness of 20 nm by sputtering. Finally, a 2000 nm thick silicon nitride layer was formed on the second electrode 9 by CVD. This layer was used as a sealing film (not shown) to prevent moisture from entering the organic compound layers.

Thus, an organic EL display device was produced which includes pixels, each defined by three organic EL elements that emit red, green and blue lights. In the organic EL display device, the pixels were arranged with a high definition at a pitch of 1.2 µm, and the aperture ratio was as high as 50%. Also, emission of red, yellow and blue lights from the organic EL elements was observed through an optical microscope, and emission unevenness was not observed in any organic EL element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-101426 filed Apr. 28, 2011 and No. 2012-077573 filed Mar. 29, 2012, which are hereby incorporated by reference herein in their entirety.

What is claimed is:

1. A method for manufacturing an organic EL display device including a first organic EL element and a second organic EL element on a substrate, wherein the first organic EL element includes a first organic compound layer between a first electrode and a second electrode and the second organic EL element includes a second organic compound layer between a third electrode and the second electrode, the method comprising:
   forming the first organic compound layer over the substrate on which the first electrode and the third electrode are disposed;
   selectively forming a release layer on the first organic compound layer on the first electrode;
   removing the first organic compound layer that is not covered by the release layer;
   forming the second organic compound layer by vapor deposition over the substrate on which the release layer, the first organic compound layer, and the third electrode remain;
   removing a portion of the second organic compound layer, wherein the portion of the second organic compound layer overlies the release layer, by dissolving the release layer; and
   forming the second electrode on the remaining first organic compound layer and the remaining second organic compound layer.

2. The method according to claim 1, wherein a total thickness of the first organic compound layer and the release layer is larger than a thickness of the second organic compound layer after the forming of the second organic compound layer.

3. The method according to claim 1, wherein the organic EL display device includes a third organic EL element on the substrate, wherein the third organic EL element includes a third organic compound layer between a fourth electrode and the second electrode, the method further comprising
   selectively forming a second release layer on the remaining first organic compound layer formed on the first electrode and the remaining second organic compound layer formed on the third electrode;
   removing the remaining second organic compound layer that is not covered by the second release layer;
   forming the third organic compound layer by vapor deposition over the substrate, on which the second release layer is left; and
   removing a portion of the third organic compound layer, wherein the portion of the third organic compound layer overlies the second release layer, by dissolving the second release layer, between the removing of the portion of the second organic compound layer, which overlies the release layer, and the forming of the second electrode,
   wherein in the forming of the second electrode, the second electrode is formed on the remaining first organic compound layer, the further remaining second organic compound layer, and the remaining third organic compound layer.

4. The method according to claim 3, wherein said selectively forming the second release layer and said removing the remaining second organic compound layer that is not covered by the second release layer are performed by
   forming the second release layer over an entire surface of the substrate on which the second organic compound layer is formed,
   selectively forming a photoresist layer above the first organic compound layer on the first electrode and the second organic compound layer on the third electrode by a photolithography method, and removing the second release layer and the remaining second organic compound layer together that are not covered by the photoresist layer.

5. The method according to claim 4, further comprising forming a second protective layer on the second release layer before selectively forming the photoresist layer; and removing the second protective layer that is not covered by the photoresist layer after selectively forming the photoresist layer above the remaining first organic compound layer on the first electrode and the remaining second organic compound layer on the third electrode and before removing the second release layer and the remaining second organic compound layer that are not covered by the photoresist layer.

6. The method according to claim 5, wherein the removing of the second release layer and the second organic compound layer is performed using an etching gas with which the second protective layer is etched at a lower rate than the second release layer and the second organic compound layer.

7. The method according to claim 5, wherein the removing of the second protective layer and the removing of the second release layer and the second organic compound layer are continuously performed.

8. The method according to claim 1, wherein said selectively forming the release layer and said removing the first organic compound layer that is not covered by the release layer are performed by forming the release layer over the substrate on which the first organic compound layer is formed, selectively forming a photoresist layer above the first organic compound layer on the first electrode by a photolithography method, and removing the release layer and the first organic compound layer together that are not covered by the photoresist layer.

9. The method according to claim 8, further comprising:

forming a protective layer on the release layer before selectively forming the photoresist layer; and removing the protective layer that is not covered by the photoresist layer after selectively forming the photoresist layer and before removing the release layer and the first organic compound layer together that are not covered by the photoresist layer.

10. The method according to claim 9, wherein the removing of the release layer and the first organic compound layer is performed by dry etching using an etching gas with which the protective layer is etched at a lower rate than the release layer and the first organic compound layer.

11. The method according to claim 9, wherein the removing of the protective layer and the removing of the release layer and the first organic compound layer are continuously performed.

* * * * *